(12) United States Patent
Yao et al.

(10) Patent No.: US 8,022,425 B2
(45) Date of Patent: Sep. 20, 2011

(54) SEMICONDUCTOR DEVICE

(75) Inventors: Chiu-Lin Yao, Hsinchu (TW);
Min-Hsun Hsieh, Hsinchu (TW);
Tzer-Perng Chen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 89 days.

(21) Appl. No.: 12/314,730

(22) Filed: Dec. 16, 2008

(65) Prior Publication Data

US 2009/0166666 A1 Jul. 2, 2009

(30) Foreign Application Priority Data

Dec. 26, 2007 (TW) .............................. 96150472 A

(51) Int. Cl.
*H01L 33/00* (2010.01)
(52) U.S. Cl. ........ 257/98; 257/79; 257/94; 257/E33.001
(58) Field of Classification Search ..................... 257/79, 257/94, 98
See application file for complete search history.

(56) References Cited

U.S. PATENT DOCUMENTS 6,847,057 B1 * 1/2005 Gardner et al. ................. 257/99
2005/0145864 A1 * 7/2005 Sugiyama et al. .............. 257/95
2007/0018187 A1 * 1/2007 Lee et al. ........................ 257/98

FOREIGN PATENT DOCUMENTS

CN 1201412 5/2005

OTHER PUBLICATIONS

Shun-Cheng Hsu et al., "High-Efficiency 1-mm2 AlGaInP LEDs Sandwiched by ITO Omni- Directional Reflector and Current-Spreading Layer", IEEE Photonics Technology Letters, vol. 19, No. 7, Apr. 1, 2007.
Y. J. Lee, et al., "Increasing the Extraction Efficiency of AlGaInP LEDs via n-Side Surface Roughening", IEEE Photonics Technology Letters, vol. 17, No. 11, Nov. 2005.

* cited by examiner

*Primary Examiner* — Wai-Sing Louie
(74) *Attorney, Agent, or Firm* — Bacon & Thomas, PLLC

(57) ABSTRACT

An exemplary semiconductor device is provided. The semiconductor device includes a semiconductor stacked layer and a conductive structure. The conductive structure is located on the semiconductor stacked layer. The conductive structure includes a bottom portion and a top portion on opposite sides thereof. The bottom portion is in contact with the semiconductor stacked layer. A ratio of a top width of the top portion to a bottom width of the bottom portion is less than 0.7. The conductive structure can be a conductive dot structure or a conductive line structure.

22 Claims, 11 Drawing Sheets

SEMICONDUCTOR DEVICE

TECHNICAL FIELD

The present invention relates to a semiconductor device and in particular to a semiconductor device having a conductive structure.

REFERENCE TO RELATED APPLICATION

This application claims the right of priority based on TW application Ser. No. 096150472, filed "Dec. 26, 2007", entitled "Photoelectric Device" and the contents of which are incorporated herein by reference.

BACKGROUND

Light-emitting diodes (LEDs) are semiconductors that are widely used in light sources. Comparing to conventional tungsten lamps or cold cathode fluorescent lamps (CCFLs), LEDs consume less power and have longer lifetime. Therefore, LEDs are replacing the conventional light sources gradually, and utilized in various fields. For example, the LEDs are capable of being employed in traffic lights, optical display devices, data storage devices, communication devices, illuminative equipments and medical equipments. The desire of brightness of the LEDs increases as the usage and development of the LEDs evolves, thus one of the main goals of engineers who design LEDs is to increase the brightness of the LEDs.

One method for enhancing brightness and luminous flux of LEDs is to enlarge surface area of a chip. However, when the surface area of the chip is enlarged, an electric current can not be spread uniformly from a contact electrode into a light-emitting layer; and if the surface area of the contact electrode is enlarged to make the electric current spread uniformly, an effect of light blocking would occur and thus the light extraction is reduced. In this regard, how to spread the electric current uniformly in the light-emitting layer and increase the brightness of the LED without changing the surface area of the contact electrode is a problem need to be solved.

A conventional method for spreading the electric current is performed by using a semi-transparent current spreading layer formed on a p-type semiconductor layer. Generally, for reducing effect of absorbing light, it is preferred to have a thinner semi-transparent current spreading layer. However, the thinner the semi-transparent current spreading layer is, the higher its sheet resistance is.

What is needed, therefore, is a semiconductor device that can overcome the above-mentioned shortcomings.

SUMMARY

An exemplary semiconductor device is provided. The semiconductor device includes a semiconductor stacked layer and a conductive structure located on the semiconductor stacked layer. The conductive structure includes a bottom portion and a top portion on opposite side thereof. The bottom portion is in contact with the semiconductor stacked layer. A ratio of a top width of the top portion to a bottom width of the bottom portion is less than 0.7. The conductive structure can be a conductive dot structure or a conductive line structure.

In an embodiment of the present invention, a height from the bottom portion to the top portion is greater than the bottom width.

In an embodiment of the present invention, the bottom width is less than a wavelength of light generated by the semiconductor device.

In an embodiment of the present invention, the semiconductor device further includes a roughened structure or a periodic concave-convex structure formed on a surface of the semiconductor stacked layer.

In an embodiment of the present invention, the semiconductor device further includes a protective layer formed on sidewalls of the conductive structure.

In an embodiment of the present invention, the semiconductor device further includes a transparent conductive layer formed on the conductive structure.

In an embodiment of the present invention, the semiconductor device further includes a second transparent conductive layer located between the conductive structure and the semiconductor stacked layer.

In an embodiment of the present invention, the semiconductor device further includes a plurality of grooves filled with an insulating protective layer in the semiconductor stacked layer.

In an embodiment of the present invention, the semiconductor stacked layer includes an upper surface with an average roughness greater than 0.1 µm.

Another exemplary semiconductor device is provided. The semiconductor device includes a semiconductor stacked layer and a conductive structure located on the semiconductor stacked layer. The conductive structure includes a bottom portion and a top portion on opposite side thereof. The bottom portion is in contact with the semiconductor stacked layer. A height from the bottom portion to the top portion is greater than a bottom width of the bottom portion.

In an embodiment of the present invention, the semiconductor device further includes a protective layer formed on sidewalls of the conductive structure.

An exemplary semiconductor device is provided. The semiconductor device includes a semiconductor stacked layer and a conductive structure. The semiconductor stacked layer has a first semiconductor layer, an active layer and a second semiconductor layer. The conductive structure is formed the first semiconductor layer and/or the second semiconductor layer.

In an embodiment of the present invention, the semiconductor device further includes a transparent conductive layer formed on the semiconductor stacked layer.

An exemplary backlight module is provided. The backlight module includes a light source device, an optical device and a power supply system. The light source device has the semiconductor device of one of the above embodiments. The optical device is located on a light output path of the light source device. The power supply system is adapted to provide electrical power for the light source.

An exemplary illumination device is provided. The illumination device includes a light source device, a power supply system and control element. The light source device has the semiconductor device of one of the above embodiments. The power supply system is adapted to provide electrical power for the light source. The control element is used for controlling the power supply system to input the electric power into the light source device.

DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Reference will now be made to the drawings to describe various exemplary embodiments of the present semiconductor devices in detail.

The present invention utilizes a nano-imprint technique to form a conductive structure located between an electrode and a semiconductor stacked layer of a semiconductor device. The conductive structure can be a conductive dot structure having a plurality of conductive dots or a conductive line structure having a plurality of conductive lines. The conductive structure can spread electric current in the semiconductor stacked layer uniformly from the electrode. A width of the conductive structure formed by the nano-imprint process is relatively small and even less than the wavelength of light generated by the semiconductor device, and thus an undesired effect of light blocking can be reduced significantly or even avoided. As a result, a luminescent efficiency of the semiconductor device is increased. The above structure is not limited to the specific semiconductor device, and it can be used in, such as, a light-emitting device, a solar cell device, or a light-emitting diode. Various exemplary embodiments would be described as follows.

Figure 1A:
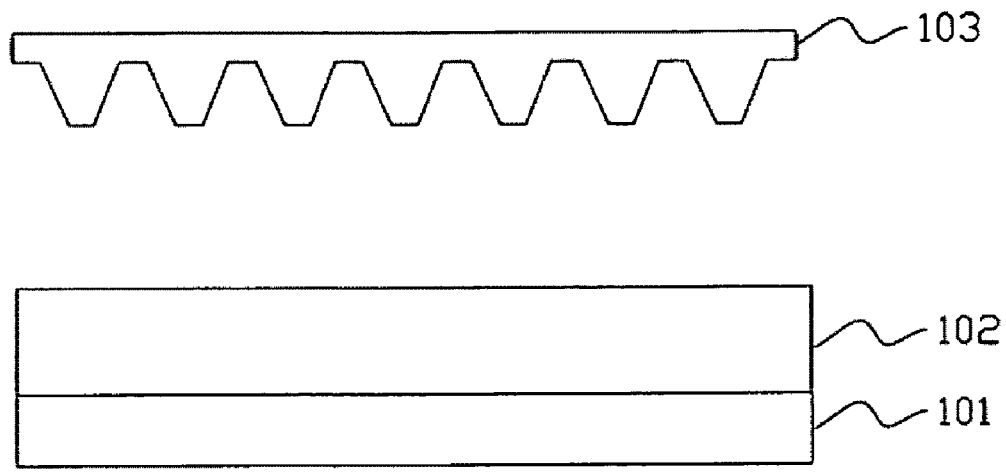
FIG. 1A shows a first step for making a semiconductor device in accordance with a first embodiment of the present invention.
Figure 1B:
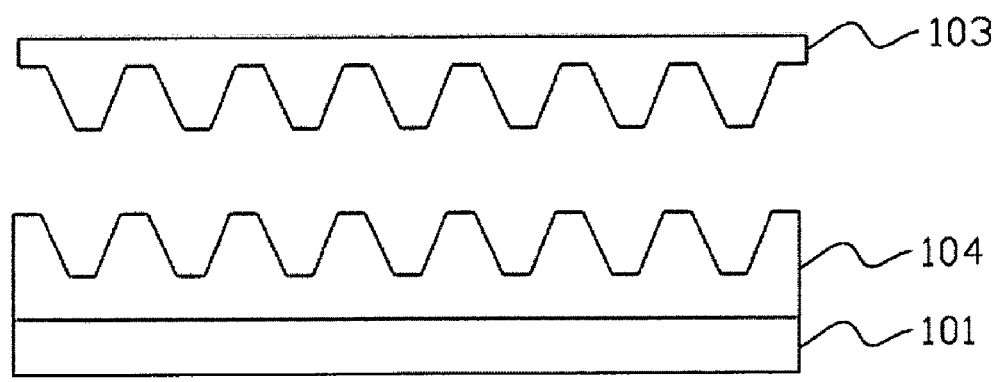
FIG. 1B shows a second step for making the semiconductor device in accordance with the first embodiment of the present invention.
Figure 1C:
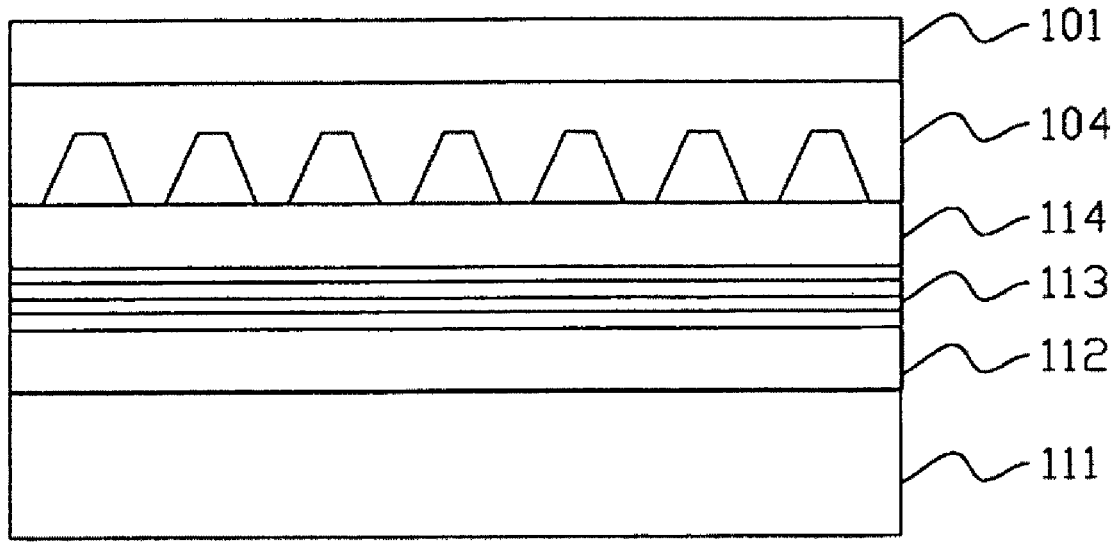
FIG. 1C shows a third step for making the semiconductor device in accordance with the first embodiment of the present invention.
Figure 1D:
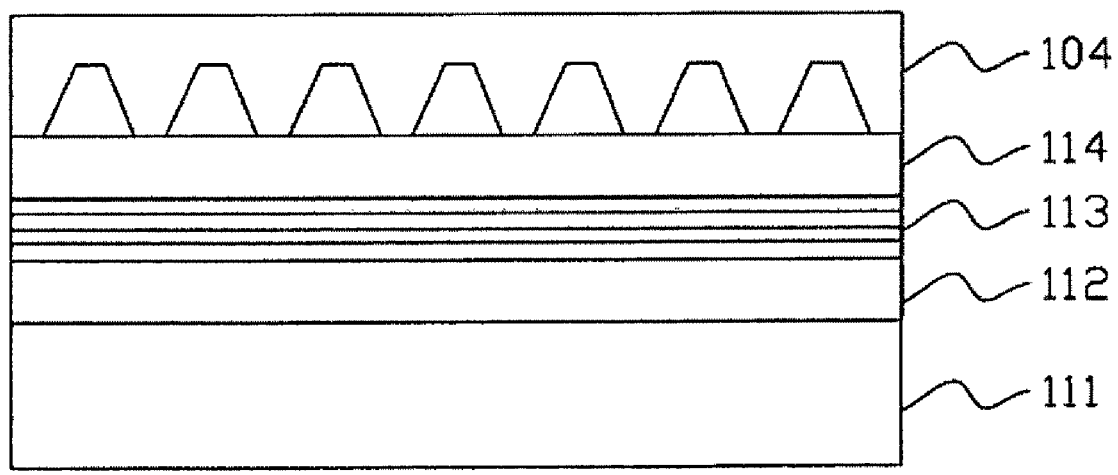
FIG. 1D shows a fourth step for making the semiconductor device in accordance with the first embodiment of the present invention.
Figure 1E:
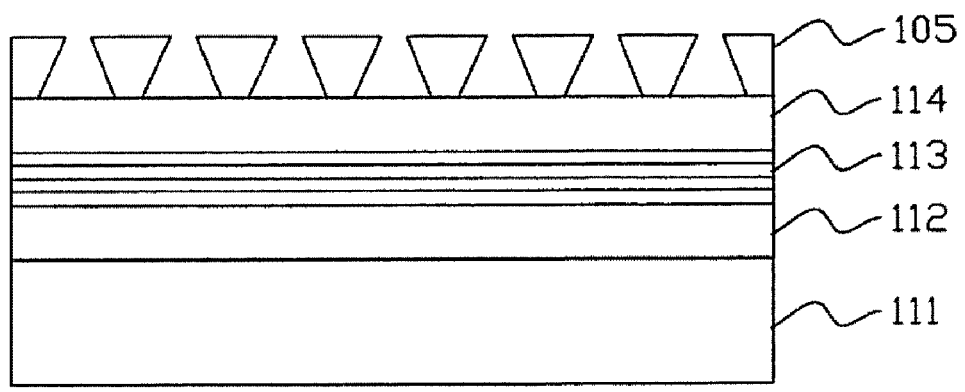
FIG. 1E shows a fifth step for making the semiconductor device in accordance with the first embodiment of the present invention.
Figure 1F:
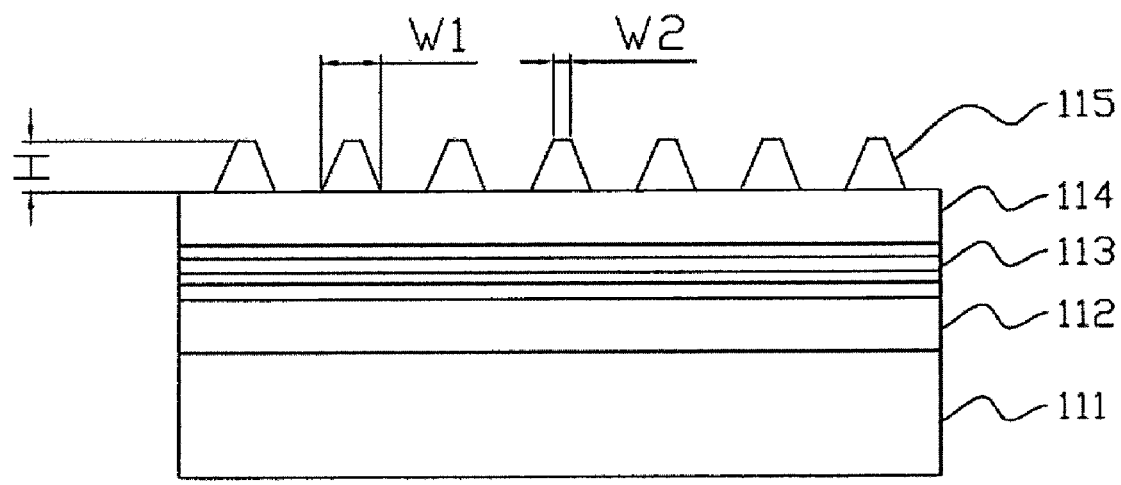
FIG. 1F shows a sixth step for making the semiconductor device in accordance with the first embodiment of the present invention.
Figure 9:
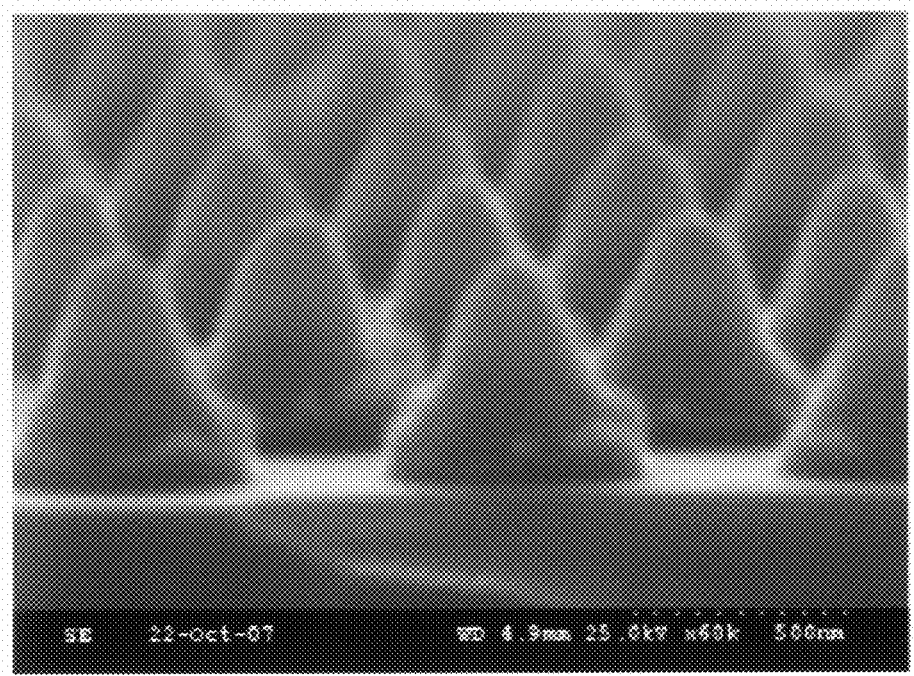
FIG. 9 is an SEM photograph showing a conductive dot structure having a plurality of conductive dots.

FIGS. 1A-1G show steps for forming a semiconductor device in accordance with a first embodiment of the present invention. As shown in FIG. 1, a photoresist layer 102 is formed on a temporary substrate 101, and an imprint mold 103 with a nano-structure is provided. As shown in FIG. 1B, the imprint mold 103 with a nano-structure imprints on the photoresist layer 102 so as to form a photoresist layer 104 with trapeziform patterns. As shown in FIG. 1C, a semiconductor stacked layer including a first semiconductor layer 112, an active layer 113 and a second semiconductor layer 114 is formed on a substrate 111, and then the photoresist layer 104 with trapeziform patterns formed during the second step is connected to the second semiconductor layer 114. As shown in FIG. 1D, the temporary substrate 101 is removed from the photoresist layer 104 by for example a stripping method. As shown in FIG. 1E, the photoresist layer 104 is etched to remove a portion of the photoresist layer 104 by $O_2$ plasma, so as to form an inverted trapeziform photoresist layer 105. As shown in FIG. 1F, the interspaces of the photoresist layer 105 are filled with conductive material by sputtering or E-beam deposition, and then the photoresist layer 105 is removed by for example the stripping method, thereby forming a conductive dot structure 115 having a plurality of conductive dots. The conductive dot of the conductive dot structure 115 has a bottom width W1, a top width W2 smaller than the bottom width W1, and a height H from the top to the bottom. The cross section of the conductive dot can be substantially triangular. Referring to FIG. 9, an actual shape of the conductive dot structure 115 obtained from a scanning electron microscope (SEM) is shown. The bottom of the conductive dot of the conductive dot structure 115 is in contact with the second semiconductor layer 114. The bottom width W1 is less than 5 μm. Preferably, the bottom width W1 is in the range from 0.1 μm to 3 μm. A ratio of the top width W2 to the bottom width W1 is less than 0.7. Preferably, the ratio of the top width W2 to the bottom width W1 is less than 0.35, or a cross section of each conductive dot is approximately triangular. The height H is greater than the bottom width W1. Preferably, a ratio of the height H to the bottom width W1 is greater than 1.5. Furthermore, the bottom width W1 and the top width W2 is less than a wavelength of light generated by the semiconductor device, and the height H is greater than 50 μm.

Figure 1G:
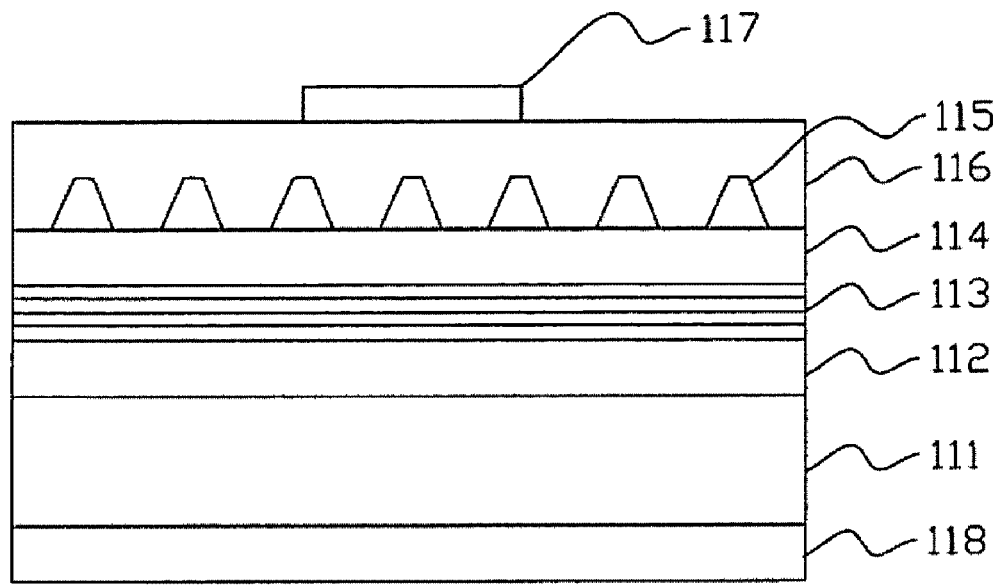
FIG. 1G is a cross-section view of a structure of the semiconductor device in accordance with the first embodiment of the present invention.
Figure 1H:
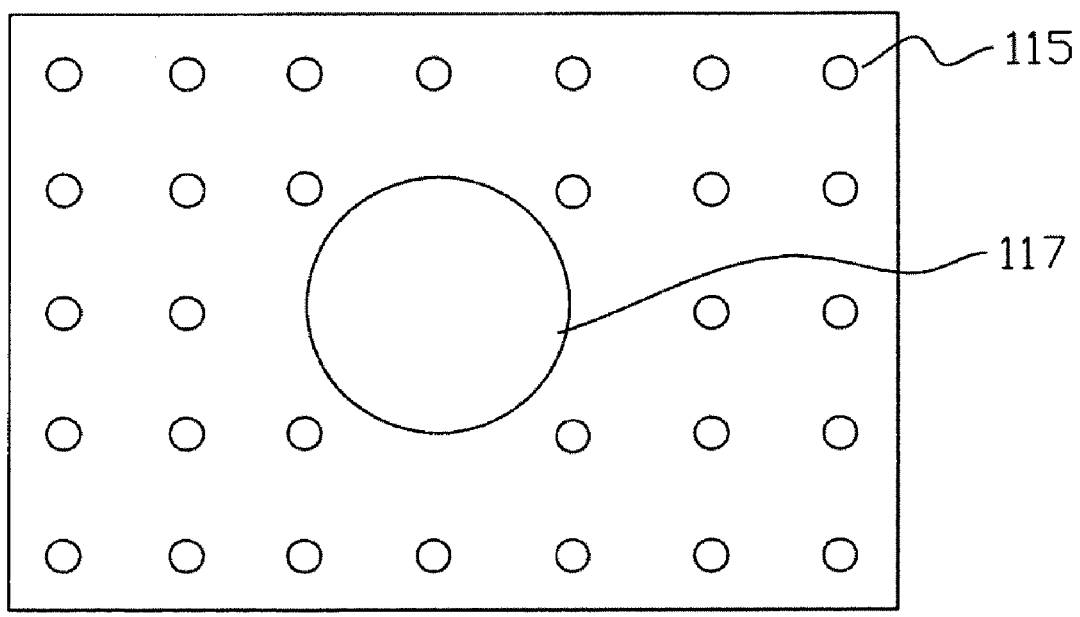
FIG. 1H is a top perspective view of the structure of the semiconductor device of FIG. 1G.

As shown in FIG. 1G, finally, a transparent conductive layer 116 is formed on the conductive dot structure 115, a first electrode 117 is formed on the transparent conductive layer 116, and a second electrode 118 is formed under the substrate 111. As such, the semiconductor device of the first embodiment of the present invention that includes the conductive dot structure 115 having the plurality of conductive dots for spreading the electric current uniformly has been made. FIG. 1H, is a top perspective view of the structure of the semiconductor device of FIG. 1G, showing the conductive dot structure 115 having the plurality of conductive dots distributed in the semiconductor device. The electric current from the first electrode 117 is transversely spread by the transparent conductive layer 116 flows into the conductive dot structure 115; and before the electric current flows into the semiconductor stacked layer, the conductive dot structure 115 may spread the electric current uniformly. Consequently, the electric current would not concentrate on a region under the electrode 117.

The temporary substrate 101 can be a metallic substrate, an insulating substrate, a semiconductor substrate or a thermoplastic polymer substrate, such as a copper (Cu) substrate, a nickel (Ni) substrate, an epoxy resin substrate, a sapphire substrate, or gallium nitride (GaN) substrate. The substrate 111 can be made of composite material, ceramic material, sapphire, silicon carbide (SiC), silicon (Si), zinc oxide (ZnO), magnesium oxide (MgO), aluminum nitride (AlN), gallium nitride (GaN), gallium phosphide (GaP), gallium arsenide (GaAs), gallium aluminum arsenide (AlGaAs), gallium arsenide phosphide (GaAsP), or metal, such as copper or nickel. The photoresist layer 102 can be made of flexible metal, UV-curable resin, thermosetting material, thermoplastic polymer, or indium tin oxide. The imprint mold 103 can be formed with a patterning process by the following materials: silicon (Si), a nickel (Ni), gallium nitride (GaN), silicon dioxide (SiO$_2$), sapphire, or polymer. The first semiconductor layer 112, the active layer 113 and the second semiconductor layer 114 can be formed with an epitaxial process by aluminum indium gallium phosphide (AlGaInP) series semiconductor or indium gallium nitride (InGaN) series semiconductor. The conductive dot structure 115 can be made of aurum (Au), silver (Ag), chromium/aurum (Cr/Au), aurum/beryllium-aurum/aurum (Au/BeAu/Au), aurum/germanium-aurum-nickel/aurum (Au/GeAuNi/Au), or carbon nanotube. The transparent conductive layer 116 can be made of indium tin oxide, indium zinc oxide, cadmium tin oxide, zinc oxide, indium oxide, tin oxide, copper aluminum oxide, copper gallium oxide, strontium copper oxide, or carbon nanotube. The first electrode 117 and the second electrode 118 each can be made of chromium/aurum (Cr/Au), titanium/platinum/aurum (Ti/Pt/Au), aurum/beryllium-aurum/aurum (Au/BeAu/Au), aurum/germanium-aurum-nickel/aurum (Au/GeAuNi/Au). The same reference numerals would be used in the same components in the following FIGS.

Figure 2A:
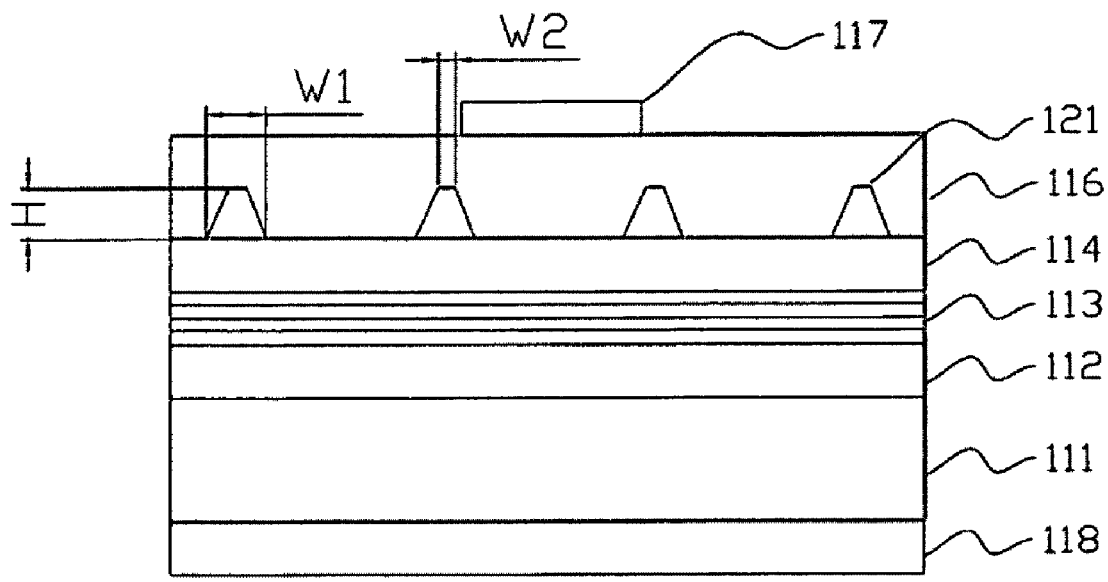
FIG. 2A is a cross-section view of a structure of a semiconductor device in accordance with a second embodiment of the present invention.
Figure 2B:
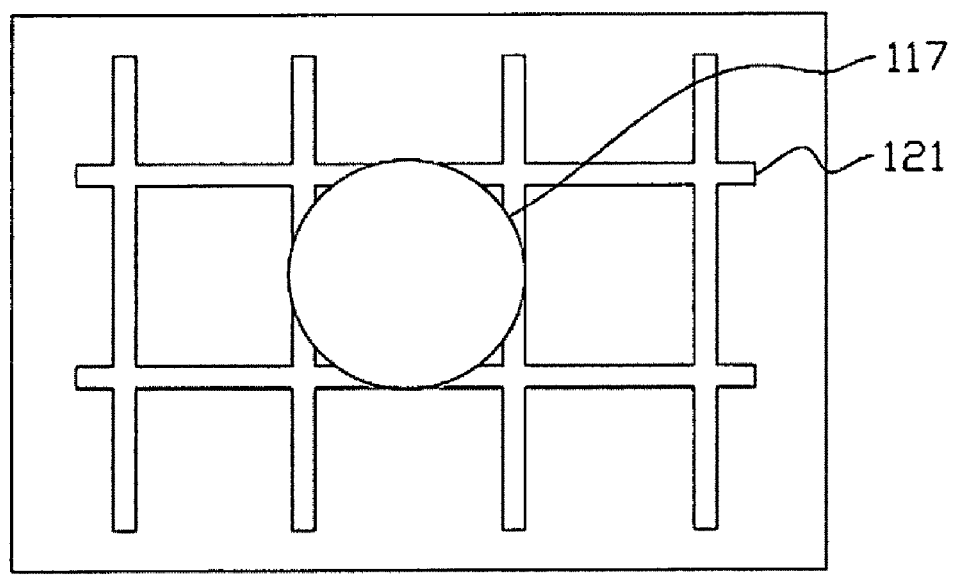
FIG. 2B is a top perspective view of the structure of the semiconductor device of FIG. 2A.
Figure 10:
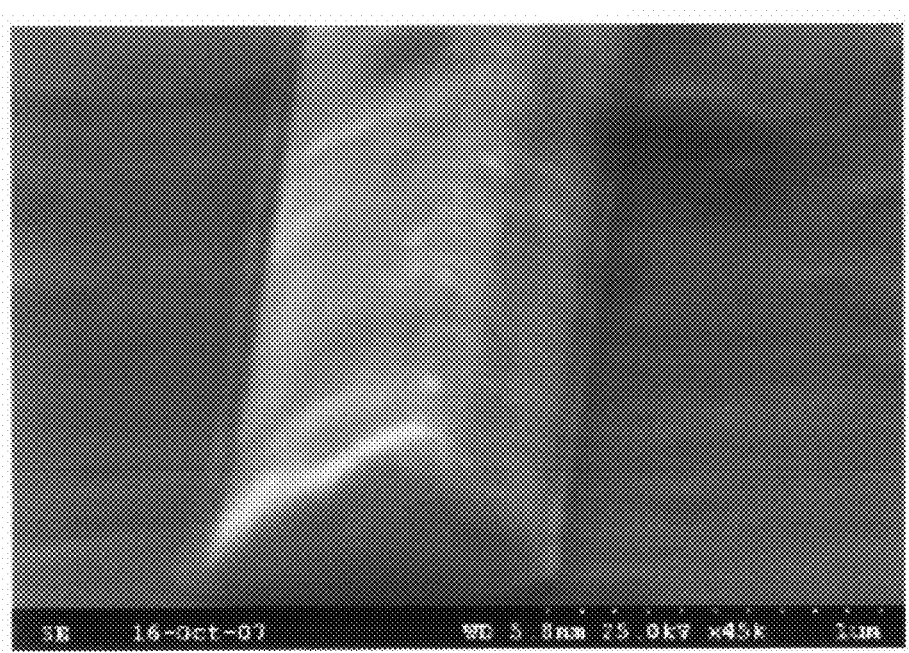
FIG. 10 is an SEM photograph showing a conductive line structure having a plurality of conductive lines.

FIGS. 2A and 2B show a semiconductor device in accordance with a second embodiment of the present invention. A structure and a manufacturing method of the semiconductor device of the second embodiment are similar in principle to that of the semiconductor device of the first embodiment. However the conductive dot structure 115 is substituted by a conductive line structure 121 having a plurality of conductive lines. The electric current that flows into the semiconductor stacked layer can be spread uniformly by the conductive line structure 121 with various patterns, as shown in FIG. 2B. The conductive line of the conductive line structure 121 has a bottom width W1, a top width W2 smaller than the bottom width W1, and a height H from the top to the bottom. The bottom of the conductive line is in contact with the second semiconductor layer 114. The bottom width W1 is less than 5 µm. Preferably, the bottom width W1 is in the range from 0.1 µm to 3 µm. A ratio of the top width W2 to the bottom width W1 is less than 0.7. Preferably, the ratio of the top width W2 to the bottom width W1 is less than 0.35, or a cross section of each conductive line is approximately triangular. The height H is greater than the bottom width W1. Preferably, a ratio of the height H to the bottom width W1 is greater than 1.5. In this embodiment, the conductive line structure 121 is elongated, and a cross section of the line of the conductive line structure 121 is triangular. Referring to FIG. 10, an actual shape of the conductive line structure 121 obtained from a SEM is shown.

Figure 3A:
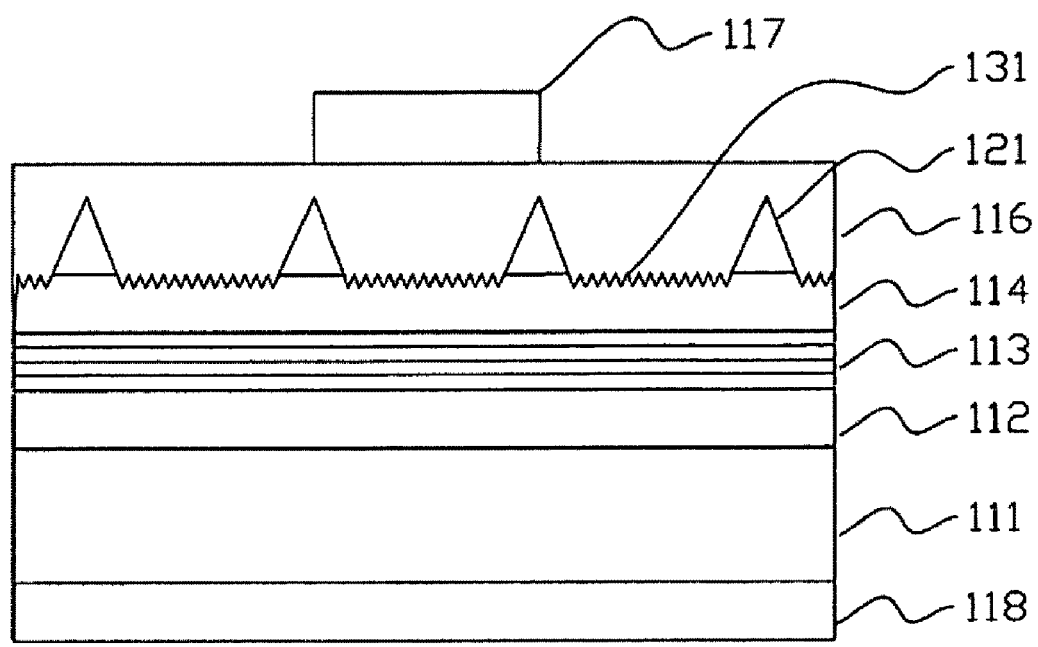
FIG. 3A is a cross-section view of a structure of a semiconductor device in accordance with a third embodiment of the present invention.
Figure 3B:
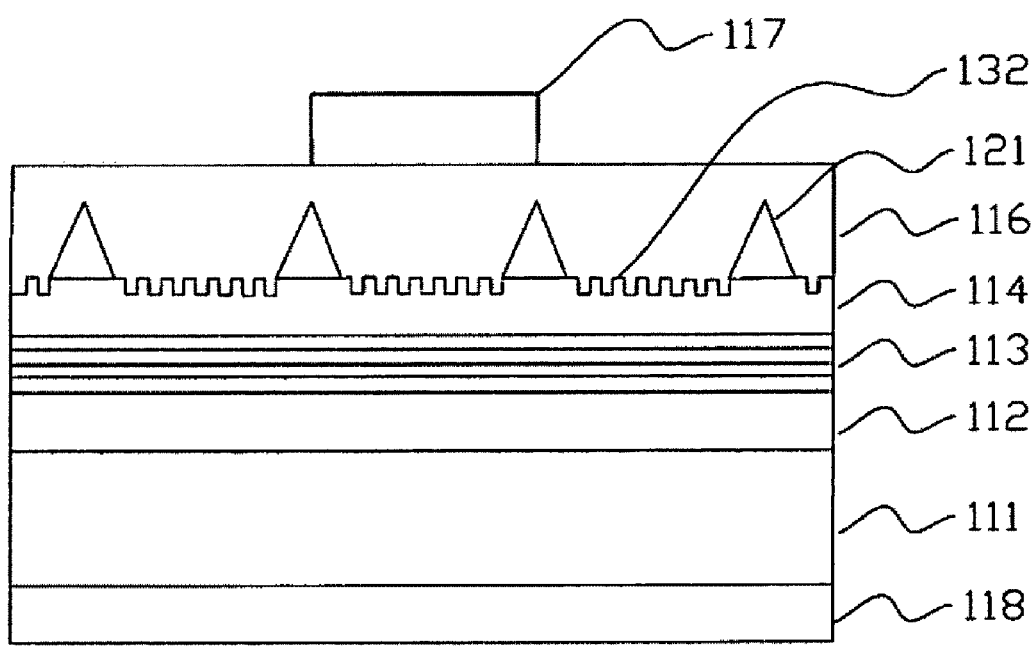
FIG. 3B is a cross-section view of a structure of a semiconductor device in accordance with a fourth embodiment of the present invention.

Furthermore, referring to FIG. 3A, which shows a structure of a semiconductor device in accordance with a third embodiment of the present invention, a roughened structure 131 is formed on a surface of the second semiconductor layer 114 by a roughening process. Referring to FIG. 3B, which shows a structure of a semiconductor device in accordance with a fourth embodiment of the present invention, a periodic concave-convex structure 132 or the like is formed on a surface of the second semiconductor layer 114. The roughened structure 131 or the periodic concave-convex structure 132 can effectively increase the light-extracting efficiency of the semiconductor device, thereby increasing the luminescent efficiency of the semiconductor device.

Figure 3C:
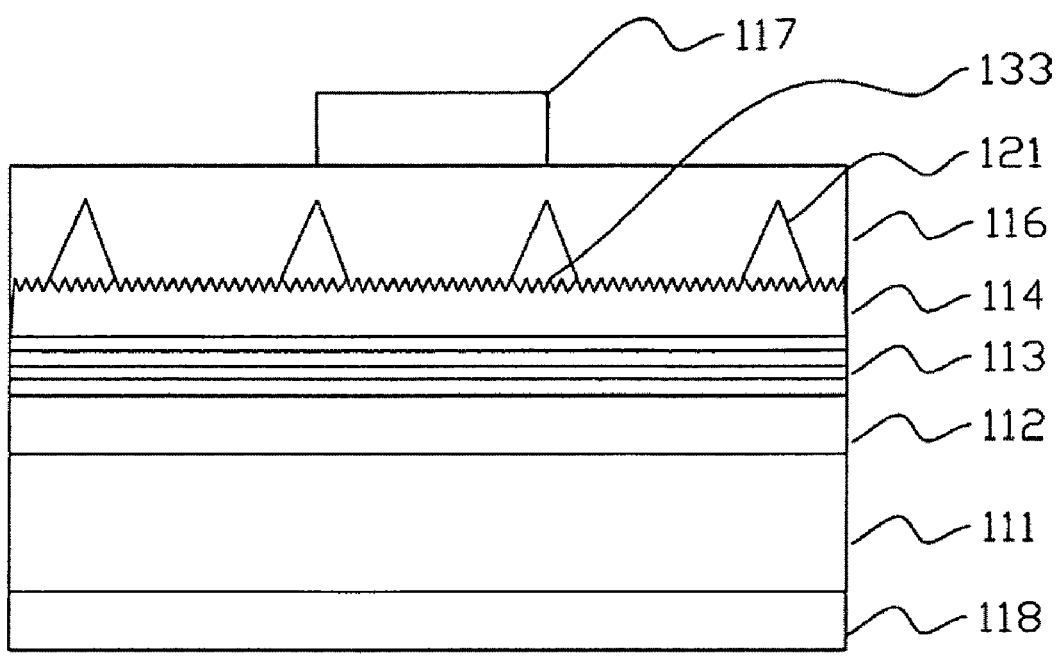
FIG. 3C is a cross-section view of a structure of a semiconductor device in accordance with a fifth embodiment of the present invention.
Figure 3D:
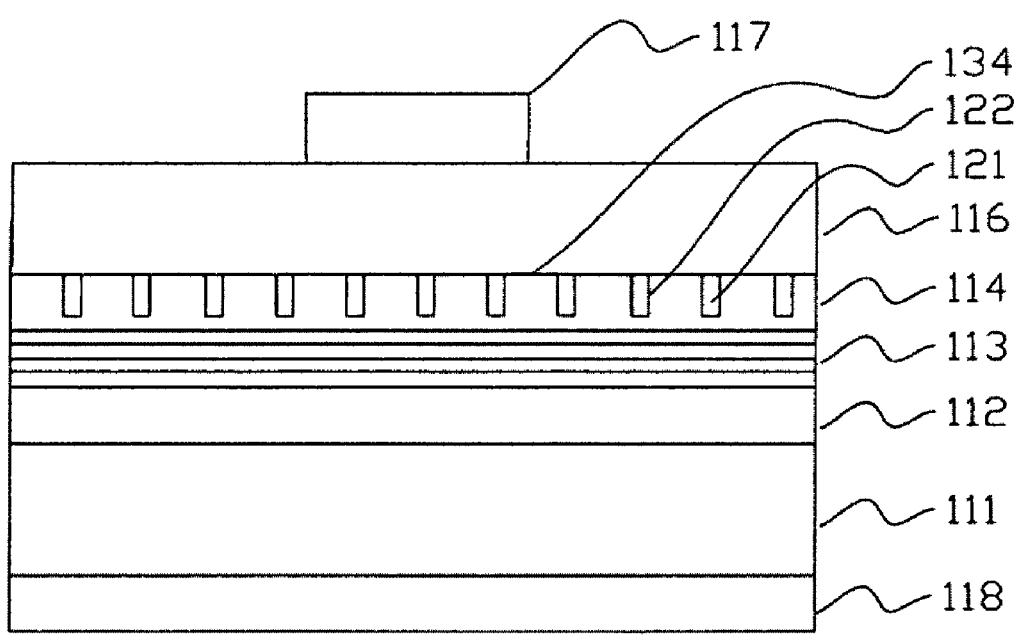
FIG. 3D is a cross-section view of a structure of a semiconductor device in accordance with a sixth embodiment of the present invention.

Unlike a conventional lithography technique, a nano-imprint technique of present invention can generate a relatively fine photoresist pattern and accomplish subsequent patterning process easily. In this regard, a semiconductor device in accordance with a fifth embodiment of the present invention as shown in FIG. 3C is provided. In the semiconductor device of the fifth embodiment, a roughness (Ra) of a surface 133 of the second semiconductor layer 114 is in the range of 0.1 µm~3 µm, and the conductive line structure 121 is formed on the surface 133 by the nano-imprint technique. In addition, a semiconductor device in accordance with a sixth embodiment of the present invention as shown in FIG. 3D is provided. During a process of making the semiconductor device of the sixth embodiment, a photoresist pattern is formed on the second semiconductor layer 114 by the nano-imprint technique, then the second semiconductor layer 114 is etched to form a plurality of groove 122, and then the groove 122 is filled with the conductive line structure 121 to form a plane 134. Finally, the transparent conductive layer 116 and the first electrode 117 are formed on the plane 134.

Figure 4A:
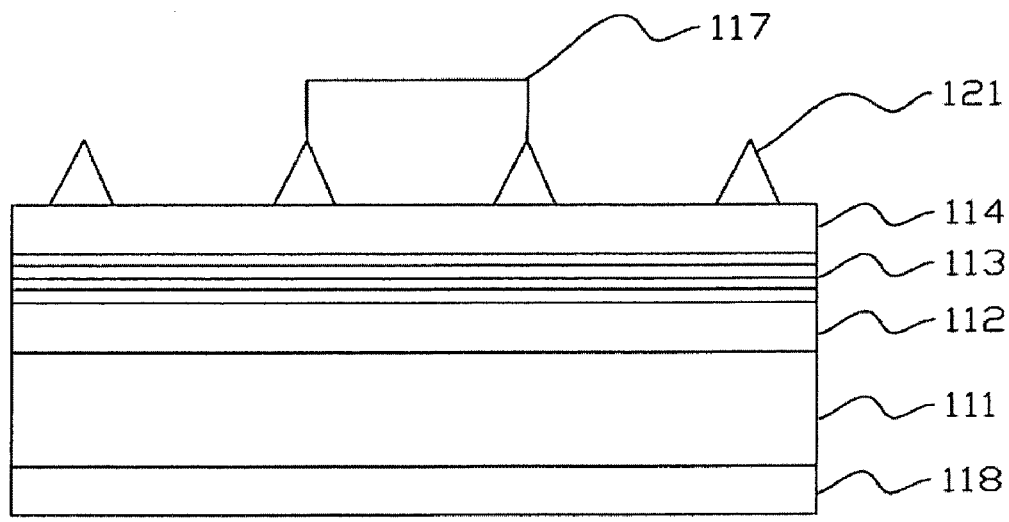
FIG. 4A is a cross-section view of a structure of a semiconductor device in accordance with a seventh embodiment of the present invention.

FIG. 4A shows a semiconductor device in accordance with a seventh embodiment of the present invention. The semiconductor device of the seventh embodiment is similar in principle to the semiconductor device of the first embodiment. However, in the semiconductor device of the seventh embodiment, the conductive line structure 121 with various patterns is located under the first electrode 117, and is electrically connected with the first electrode 117. Therefore, the electric current can flow into the conductive line structure 121 directly, and be spread uniformly by the conductive line structure 121 before flow into the semiconductor stacked layer. The electrode 117 can also include a fingerlike pattern (not shown) on the conductive line structure 121. Therefore even if the conductive line structure 121 is broken, the electrical connection can still be achieved by the electrode 117 with the fingerlike pattern.

Figure 4B:
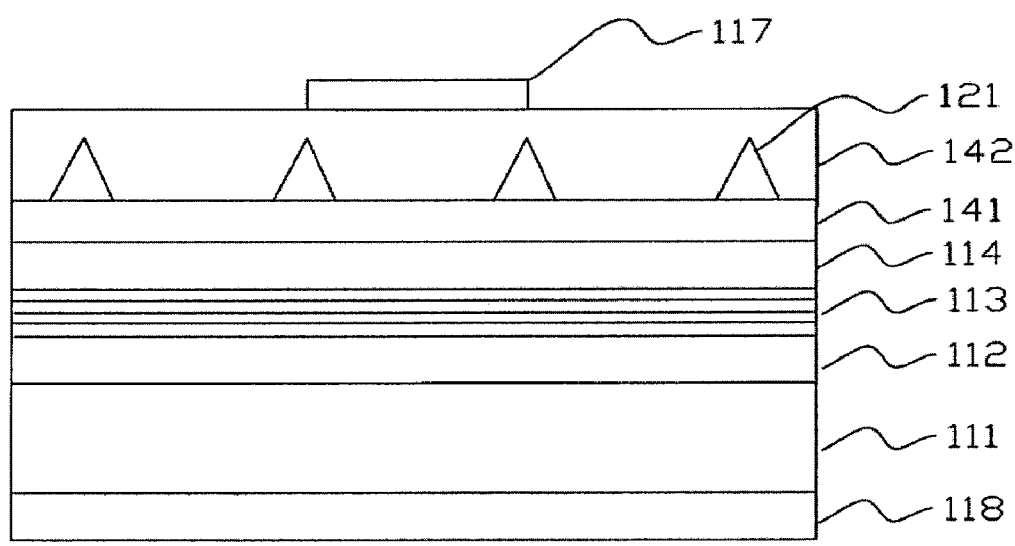
FIG. 4B is a cross-section view of a structure of a semiconductor device in accordance with an eighth embodiment of the present invention.

FIG. 4B shows a semiconductor device in accordance with an eighth embodiment of the present invention. The semiconductor device of the eighth embodiment is similar in principle to the semiconductor device of the first embodiment. However in the semiconductor device of the eighth embodiment, the first transparent conductive layer 141 is formed on the second semiconductor layer 114, the conductive line structure 121 are formed on the first transparent conductive layer 141, the second transparent conductive layer 142 is formed on the conductive line structure 121, and the electrode 117 is formed on the second transparent conductive layer 142.

Figure 5:
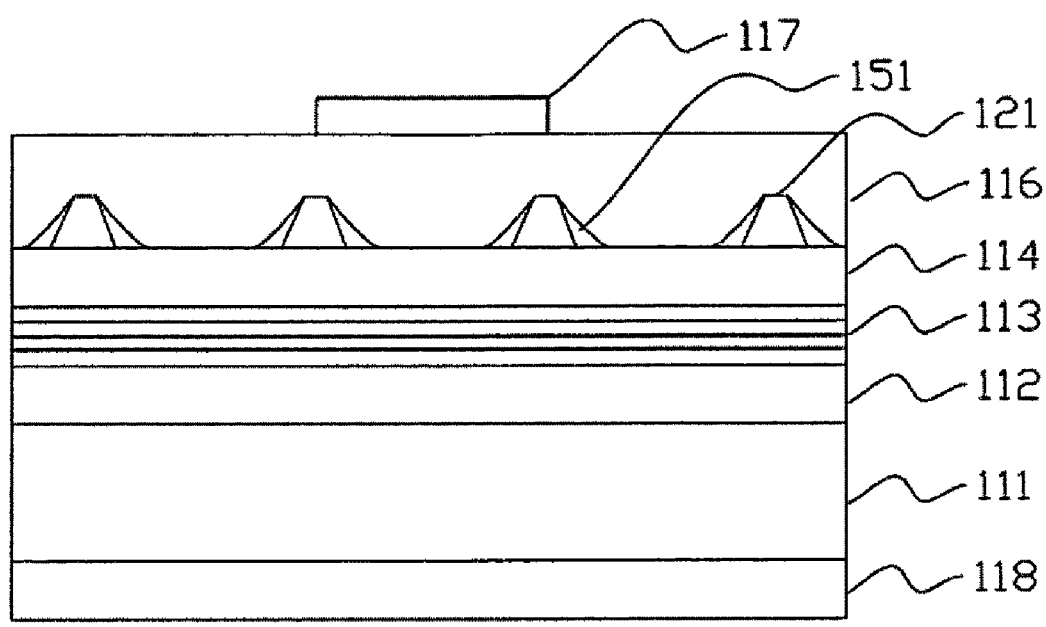
FIG. 5 is a cross-section view of a structure of a semiconductor device in accordance with a ninth embodiment of the present invention.

FIG. 5 shows a semiconductor device in accordance with a ninth embodiment of the present invention. A structure and a manufacturing method of the semiconductor device of the ninth embodiment are similar in principle to that the semiconductor device of the first embodiment. However, the semiconductor device of the ninth embodiment further includes a protective layer 151 covering the sidewalls of the conductive line structure 121. The protective layer 151 may increase joint strength between the conductive line structure 121 and the second semiconductor layer 114. Therefore, the problem that the conductive line structure 121 is prone to breaking off with a larger ratio of height to width can be solved. The protective layer 151 can be made of transparent material, such as silicon dioxide or polymer. The protective layer 151 formed on the sidewalls of the conductive line structure 121 can be performed by a sol-gel method or a spin-coating method.

Figure 6:
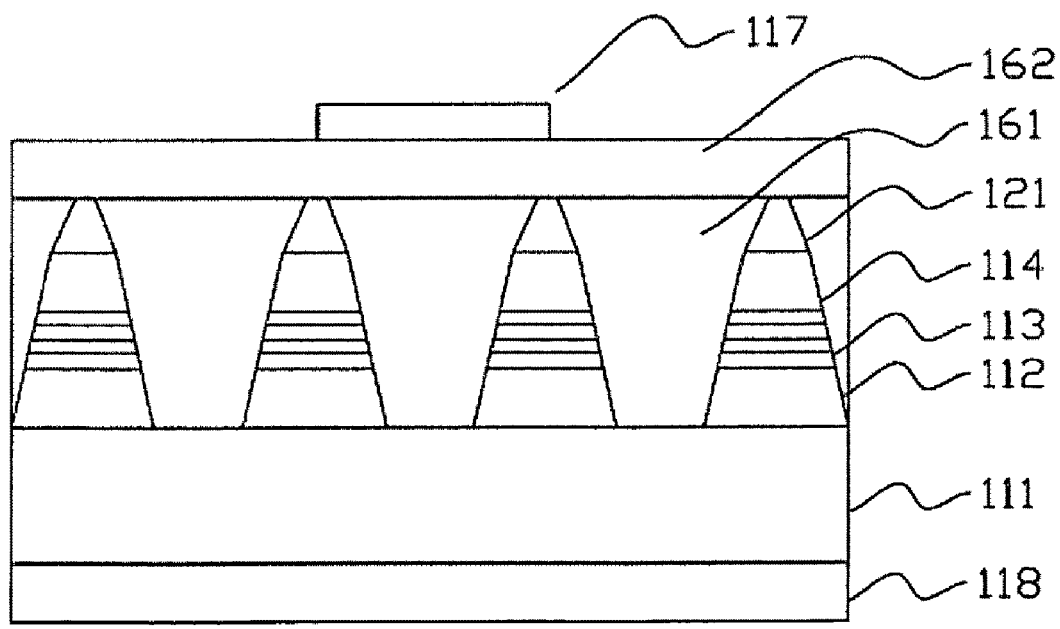
FIG. 6 is a cross-section view of a structure of a semiconductor device in accordance with a tenth embodiment of the present invention.

FIG. 6 shows a semiconductor device in accordance with a tenth embodiment of the present invention. A method for making the semiconductor device of tenth embodiment includes following steps. The conductive line structure 121 is formed on the second semiconductor layer 114 by nano-imprint technique. Then, utilizing the conductive line structure 121 as a mask to etch the semiconductor stacked layer by inductively coupled plasma, so as to form a plurality of grooves and a plurality of columnar structures of semiconductor stacked layer under the conductive line structure 121, as shown in FIG. 6. Insulating material is then applied to fill the grooves, so as to form an insulating protective layer 161. Finally, the transparent conductive layer 162 and the first electrode 117 are formed on the insulating protective layer 161. The insulating protective layer 161 can be made of epoxy resin or silicon dioxide ($SiO_2$). The columnar structures of semiconductor stacked layer may increase luminescent efficiency of the semiconductor device. In addition, that the conductive line structure 121 is utilized as the photomask may avoid using an additional photomask, thereby reducing the production cost of the semiconductor device.

The conductive dot structure and the conductive line structure in the above embodiments can be substituted with each other. The conductive structures can be made of conductive material other than metal. The conductive structures are not limited to be located between the electrode and the semiconductor stacked layer. The conductive structures for spreading the electric current can be located on two sides of the semiconductor stacked layer simultaneously, in the semiconductor stacked layer, or between different semiconductor stacked layers.

In addition, the semiconductor device mentioned above may be mounted with the substrate side down onto a submount via a solder bump or a glue material to form a light source device. Besides, the submount further comprises at least one circuit layout electrically connected to the electrode of the semiconductor device via an electrical conductive structure, such as a metal wire. The semiconductor device mentioned above may also be mounted on a submount by at least one solder bump with the substrate side facing up to form a flip chip type light source device. Besides, the submount further comprises at least one circuit layout electrically connected to the electrodes of the semiconductor device via the solder.

Figure 7:
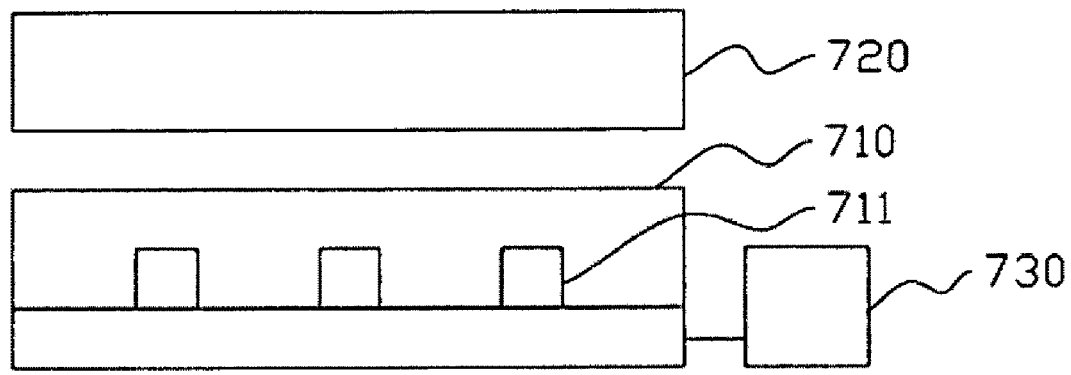
FIG. 7 is a schematic view of a backlight module in accordance with an embodiment of the present invention.

Referring to FIG. 7, a backlight module in accordance with an embodiment of the present invention is shown. The backlight module includes a light source device 710, an optical device 720 and a power supply system 730. The light source device 710 has a semiconductor device 711 of one of the above embodiments. The optical device 720 is located on a light output path of the light source device 710 for processing the light properly. The power supply system 730 is adapted to provide electrical power for the light source 710.

Figure 8:
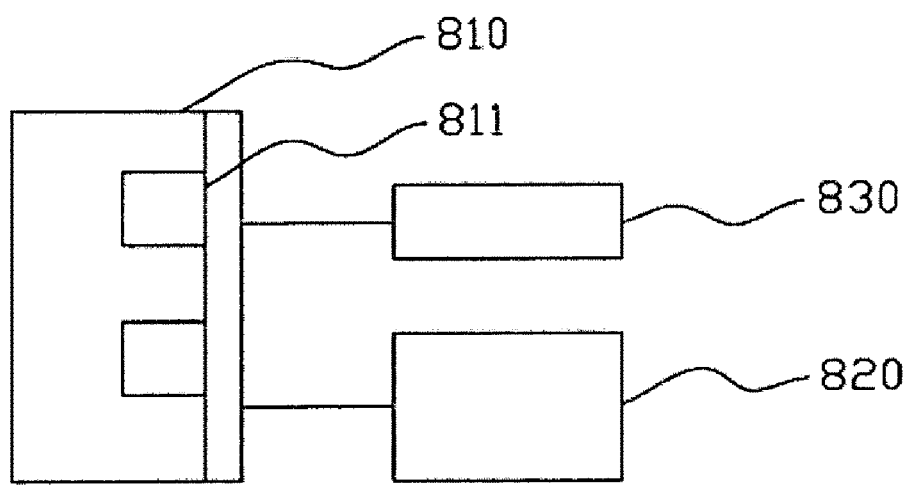
FIG. 8 is a schematic view of an illumination device in accordance with an embodiment of the present invention.

Referring to FIG. 8, an illumination device in accordance with an embodiment of the present invention is shown. The illumination device can be a car lamp, a street lamp, a road lamp, an electric torch or an indicator lamp. The illumination device includes a light source device 810, a power supply system 820 and a control element 830. The light source device 810 has a semiconductor device 811 of one of the above embodiments. The power supply system 830 is adapted to provide electrical power for the light source 810. The control element 830 is used for controlling the power supply system 820 to input electric power into the light source device 810.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A semiconductor device comprising:
  a semiconductor stacked layer; and
  a conductive structure in contact with the semiconductor stacked layer that conducts an electric current into the semiconductor stacked layer, the conductive structure having a bottom width and a top width opposite to the bottom width,
  and a protective layer formed on sidewalls of the conductive structure
  wherein a ratio of the top width to the bottom width is less than 0.7.

2. The semiconductor device according to claim 1, wherein the ratio of the top width to the bottom width is less than 0.35.

3. The semiconductor device according to claim 1, wherein a cross section of the conductive structure is triangular.

4. The semiconductor device according to claim 1, wherein the bottom width is less than 5 μm.

5. The semiconductor device according to claim 1, wherein the bottom width is less than a wavelength of light generated by the semiconductor device.

6. The semiconductor device according to claim 1, wherein a height from the bottom to the top is greater than the bottom width.

7. The semiconductor device according to claim 1, further comprising a roughened structure or a periodic concave-convex structure formed on a surface of the semiconductor stacked layer.

8. The semiconductor device according to claim 1, further comprising a transparent conductive layer formed on the conductive structure.

9. The semiconductor device according to claim 8, further comprising another transparent conductive layer located between the conductive structure and the semiconductor stacked layer.

10. The semiconductor device according to claim 1, further comprising a plurality of grooves in the semiconductor stacked layer, and an insulating protective layer filling in the grooves.

11. The semiconductor device according to claim 1, wherein the conductive structure is a conductive dot structure or a conductive line structure.

12. The semiconductor device according to claim 1, wherein the semiconductor stacked layer comprises an upper surface, and an average roughness of the upper surface is greater than 0.1 µm.

13. The semiconductor device according to claim 1, wherein the conductive structure is a conductive line structure, and the semiconductor device further comprises an electrode formed on the conductive structure.

14. The semiconductor device according to claim 13, wherein the electrode comprises a fingerlike pattern.

15. A semiconductor device comprising:
a semiconductor stacked layer;
a conductive structure located on the semiconductor stacked layer, the conductive structure including a bottom portion and a top portion on opposite sides thereof, the bottom portion in contact with the semiconductor stacked layer,
and a protective layer formed on sidewalls of the conductive structure;
wherein a height from the bottom portion to the top portion is greater than a bottom width of the bottom portion.

16. The semiconductor device according to claim 15, wherein a ratio of the height to the bottom portion is greater than 1.5.

17. The semiconductor device according to claim 15, wherein the bottom width is less than a wavelength of light generated by the semiconductor device.

18. A semiconductor device comprising:
a semiconductor stacked layer; and
a conductive structure in contact with the semiconductor stacked layer, the conductive structure having a bottom width and a top width opposite to the bottom width and the conductive structure comprising a protective layer formed on sidewalls of the conductive structure;
wherein a ratio of the top width to the bottom width is less than 0.7.

19. A semiconductor device comprising:
a semiconductor stacked layer;
a conductive structure formed on the semiconductor stacked layer, the conductive structure having a bottom width and a top width opposite to the bottom width;
a transparent conductive layer formed on the conductive structure; and
another transparent conductive layer located between the conductive structure and the semiconductor stacked layer;
wherein a ratio of the top width to the bottom width of the conductive structure is less than 0.7.

20. A semiconductor device comprising:
a semiconductor tacked layer; and
a conductive structure located on the semiconductor stacked layer, the conductive structure including a bottom portion and a top portion on opposite sides thereof, the bottom portion in contact with the semiconductor stacked layer; and
a protective layer formed on sidewalls of the conductive structure;
wherein a height from the bottom portion to the top portion is greater tans a bottom width of the bottom portion.

21. The semiconductor device according to claim 1, wherein the conductive structure is made of aurum (Au), silver (Ag), chromium/aurum
(Cr/Au), aurum/beryllium-aurum/aurum (Au/BeAu/Au), aurum/ germanium-aurum-nickel/aurum (Au/GeAuNi/Au), or carbon nanotube.

22. A semiconductor device comprising;
a semiconductor stacked layer having a first semiconductor layer, an active layer and a second semiconductor layer; and
a conductive structure formed inside one of the first of the first semiconductore layer and the second semiconductor layer;
wherein the conductive structure is a conductive dot structure or a conductive line structure, and the conductive structure is made of aurum (Au), silver (Ag), chromium/aurum (Cr/Au), aurum/beryllium-aurum/aurum (Au/BeAu/Au), aurum/ germanium-aurum-nickel/aurum (Au/GeAuNi/Au), or carbon nanotube.

* * * * *